United States Patent
Nsame et al.

(10) Patent No.: US 7,495,492 B2
(45) Date of Patent: Feb. 24, 2009

(54) DYNAMIC LATCH STATE SAVING DEVICE AND PROTOCOL

(75) Inventors: Pascal A. Nsame, Colchester, VT (US); Anthony J. Perri, Jericho, VT (US); Lansing U. Pickup, Raleigh, NC (US); Sebastian T. Ventrone, South Burlington, VT (US); Matthew R. Walland, Chandler, AZ (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 11/530,981

(22) Filed: Sep. 12, 2006

(65) Prior Publication Data

US 2008/0062748 A1    Mar. 13, 2008

(51) Int. Cl.
  *H03K 3/289* (2006.01)
(52) U.S. Cl. ................................. 327/202; 327/203
(58) Field of Classification Search .................. 327/202, 327/203, 204, 199; 365/154
  See application file for complete search history.

(56) References Cited

U.S. PATENT DOCUMENTS

| 5,065,362 | A | 11/1991 | Herdt et al. |
|---|---|---|---|
| 5,361,224 | A | 11/1994 | Takasu |
| 5,461,649 | A | 10/1995 | Bailey et al. |
| 5,646,566 | A | 7/1997 | Ross, Jr. et al. |
| 5,712,826 | A | 1/1998 | Wong et al. |
| 6,493,257 | B1 * | 12/2002 | Coughlin et al. ............ 365/156 |
| 6,667,645 | B1 | 12/2003 | Fletcher et al. |
| 6,762,638 | B2 * | 7/2004 | Correale et al. ............ 327/202 |
| 6,927,614 | B2 | 8/2005 | Oakland et al. |
| 2001/0038304 | A1 | 11/2001 | Waldie et al. |

FOREIGN PATENT DOCUMENTS

JP    58117055 A    7/1983

* cited by examiner

*Primary Examiner*—Vu A Le
(74) *Attorney, Agent, or Firm*—Gibb I.P. Law Firm, LLC; Michael LeStrange, Esq.

(57) ABSTRACT

The invention comprises a dynamic voltage state-saving latch electrical circuit comprising a charge device adapted as a storage element, an integrated recovery mechanism, a supply voltage rail connected to the charge device, a hold signal allocated to the integrated recovery mechanism, a data signal input allocated to said charge device, a data signal output distributed from the charge device, and a clock signal allotted to the charge device, wherein said integrated recovery mechanism maintains a state of the charge device independent of the charge device.

14 Claims, 4 Drawing Sheets

DYNAMIC LATCH STATE SAVING DEVICE AND PROTOCOL

BACKGROUND

1. Field of the Invention

The embodiments of the invention generally relate to a state saving circuit, and, more particularly, to a high performance state saving latch.

2. Description of the Related Art

With the increasing popularity of portable electronic devices, such as laptops, cell phones and personal digital assistants (PDAs), there is a growing need for systems that can reduce power consumption in order to extend energy storage times of the device's power supply (e.g., battery). Namely, applications that utilize CMOS integrated circuits (IC's) require circuits that utilize a minimal amount of power and have the capability to be powered down when not in use.

The term "dynamic latch," typically refers to an architecture of latch used for high performance designs where the latch node is pre-charged. Instead, the term "state-saving latch" is typically used to describe a power saving latch where at least part of the latch may be powered down. However, the state saving latches often have a multiple latch, e.g., a master and a slave latch, flip-flop, etc., configuration where only one latch is powered down. This still leaves one full latch powered up.

To save states, static latches with extra devices that are isolated and connected to an extra voltage rail are used to save the state during the period that a voltage island is disconnected. This overhead to the voltage islands increase power routing complexity, i.e., latch overhead, and generally reduces the advantage of using state saving latches and reduces the ability to effectively power down voltage islands.

U.S. Pat. No. 6,667,645 discloses a circuit comprising a dynamic latch controlled by a pulsed clock signal. U.S. Pat. No. 6,927,614 discloses a state saving circuit powered by an uninterruptible power supply.

SUMMARY

The invention comprises a dynamic voltage state-saving latch electrical circuit comprising a charge device adapted as a storage element, an integrated recovery mechanism, a supply voltage rail connected to the charge device, a hold signal allocated to the integrated recovery mechanism, a data signal input allocated to the charge device, a data signal output distributed from the charge device, and a clock signal allotted to the charge device, wherein the integrated recovery mechanism maintains a state of the charge device independent of the charge device.

In view of the foregoing, an embodiment of the invention provides a circuitry that can save the state of a latch before power-down, and restore the state of the latch after power-up without the need for additional voltage rails to maintain the state of the charge device (i.e., storage element).

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1A:
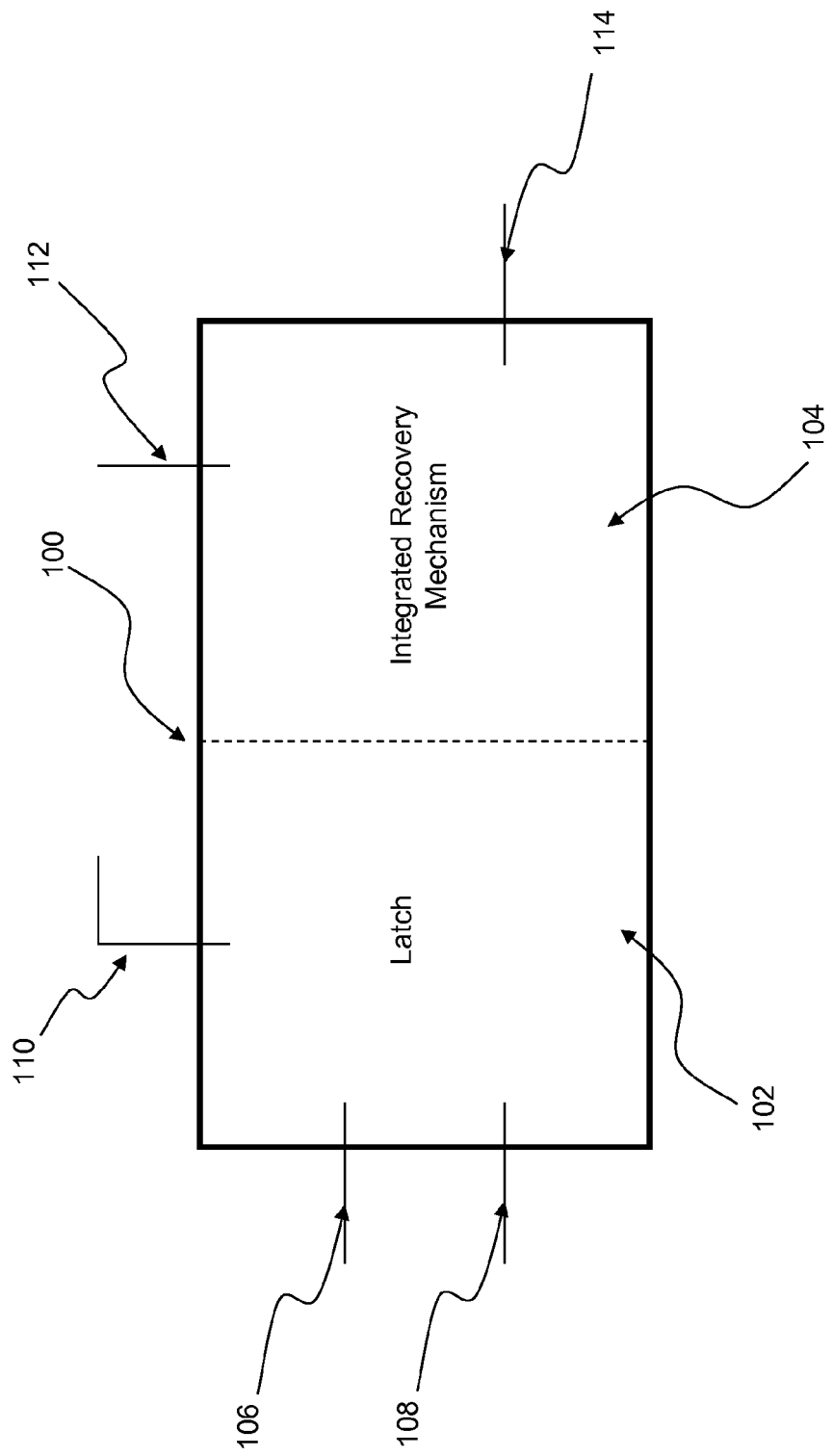
FIG. 1A illustrates a block diagram of a dynamic voltage state saving latch of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a circuitry that can save the state of a latch before power-down, and restore the state of the latch after power-up without the need for voltage rails to maintain the state of the charge device (e.g., storage element, capacitor). The embodiments of the invention achieve this by providing an integrated recovery mechanism to the storage element (e.g., charge device, capacitor) to maintain a state of the storage element during power down cycles. The invention comprises a circuit and architecture protocol to include dynamic latch structures into the voltage islands, and methods and procedures to safely maintain the voltage value during shutdown, and the return to full power on state.

Figure 1B:
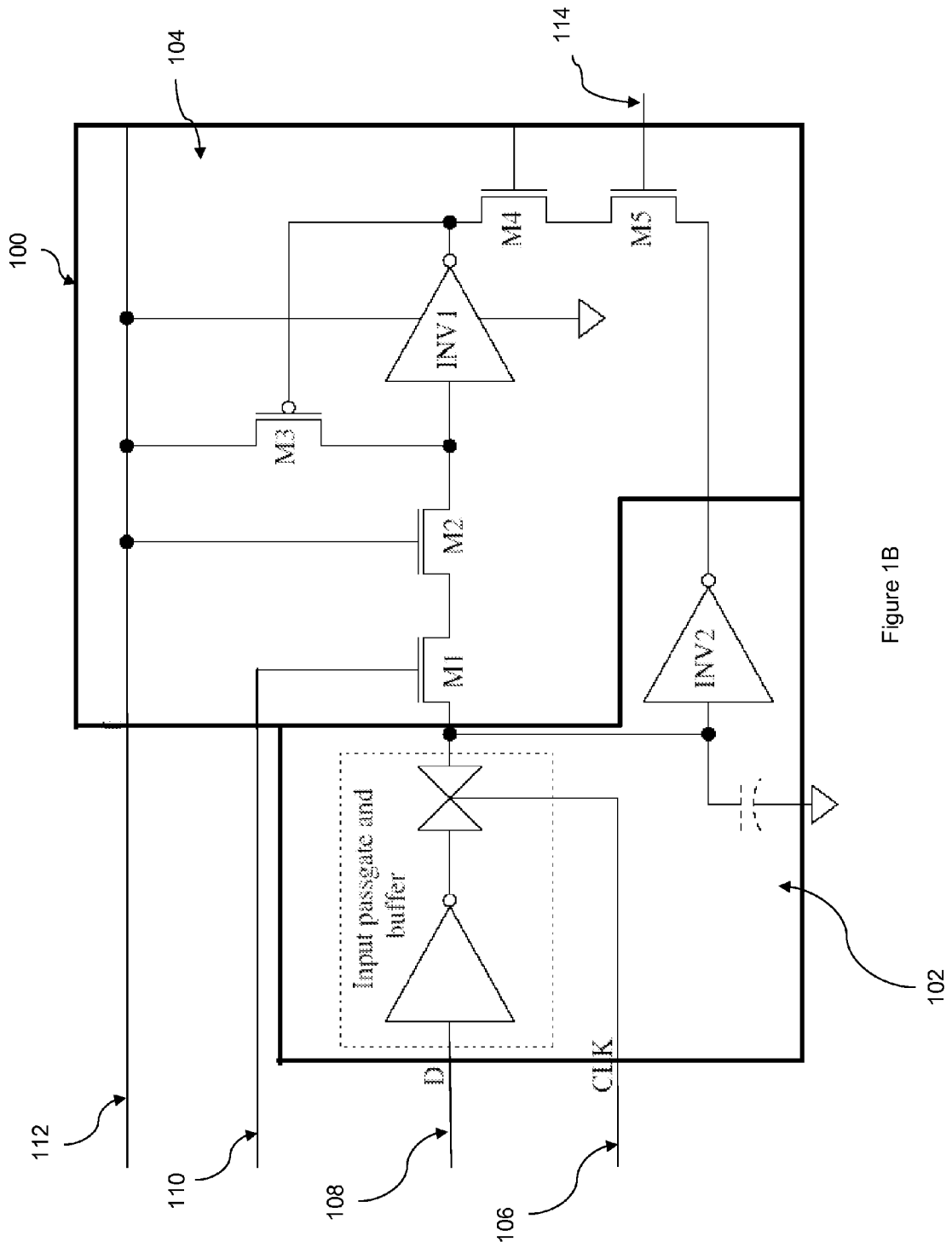
FIG. 1B illustrates a schematic diagram of a dynamic voltage state saving latch of the invention.
Figure 2:
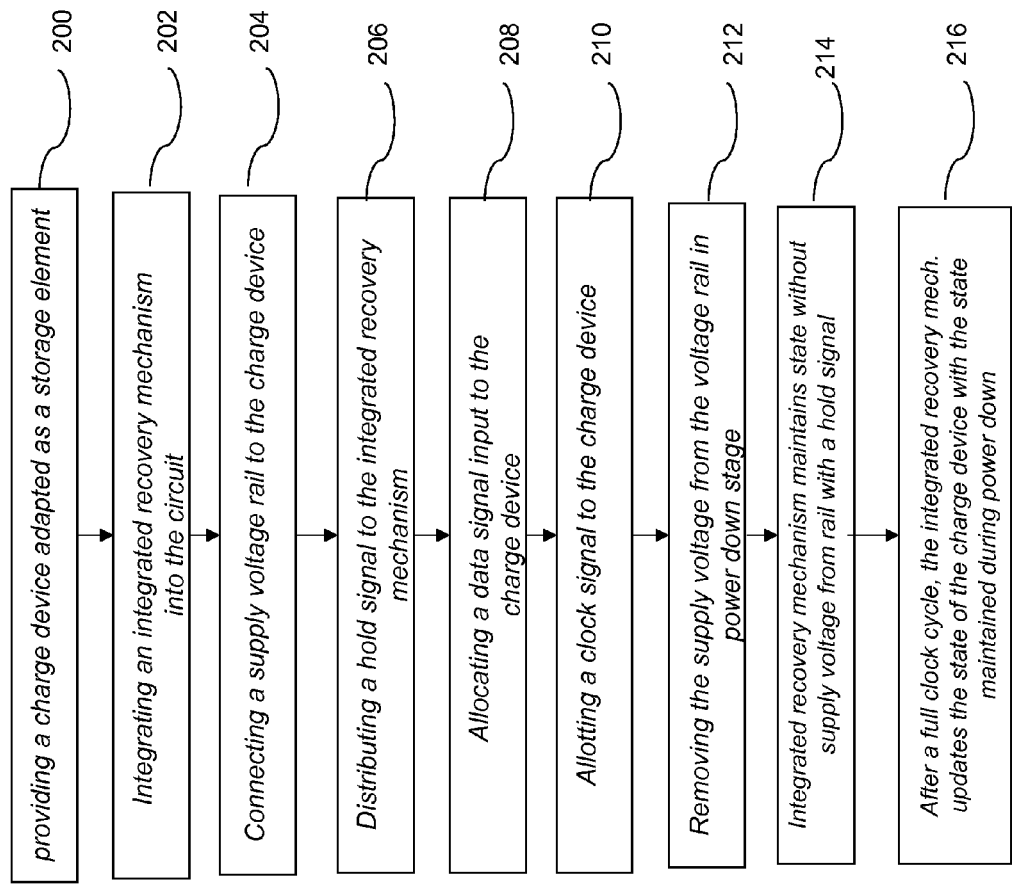
FIG. 2 is a flow diagram illustrating a preferred method of an embodiment of the invention.
Figure 3:
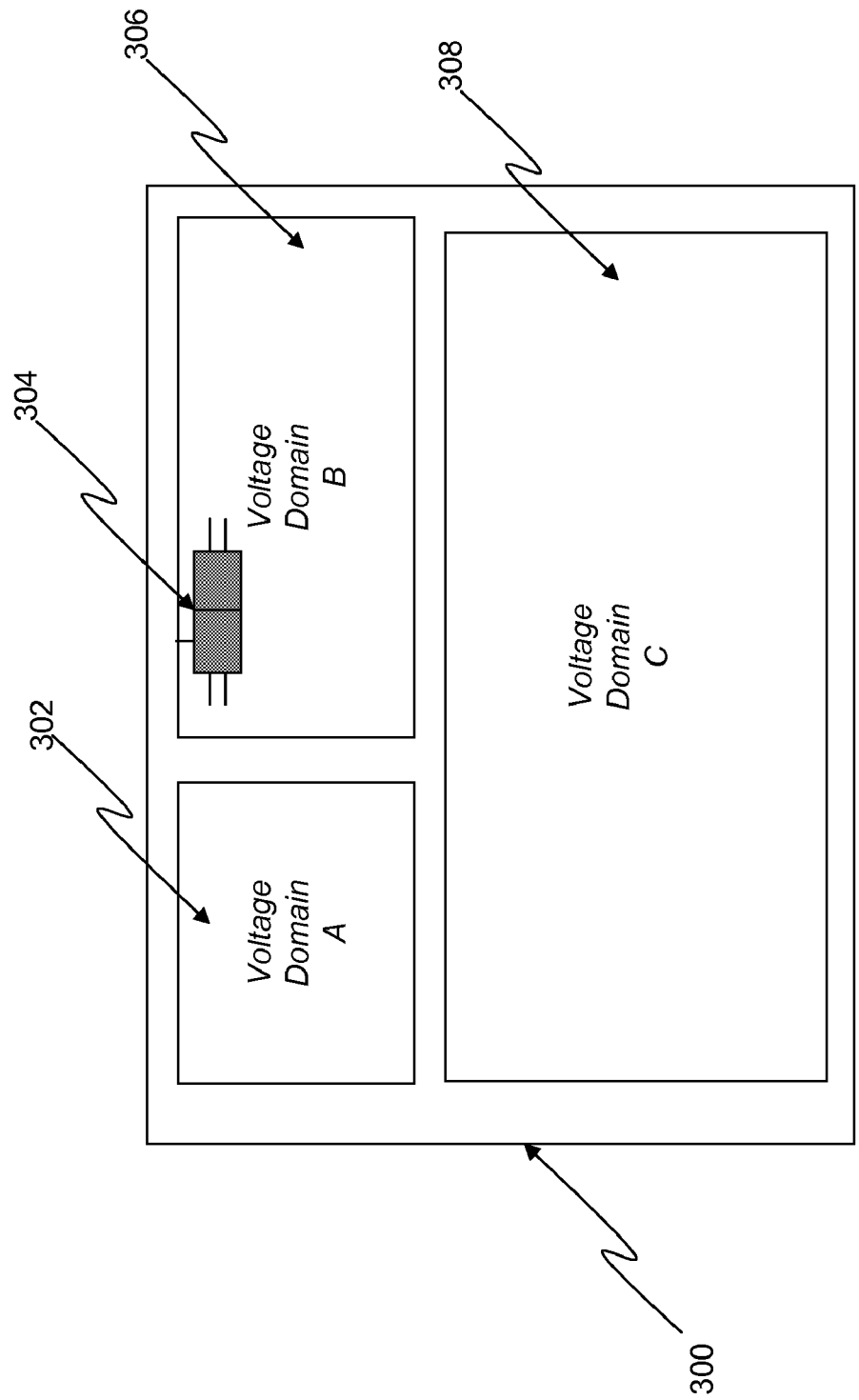
FIG. 3 illustrates a schematic of the dynamic voltage state saving latch of the invention on a silicon die having multiple voltage domains.

Referring now to the drawings, and more particularly to FIGS. 1 through 3, where similar reference characters denote corresponding features consistently throughout the figures, there are shown preferred embodiments of the invention.

FIGS. 1A and 1B illustrates a dynamic state saving latch (100). The state saving latch (100) of the invention comprises a charge device adapted as a storage element (102). The charge device may be a capacitor which stores a state (i.e., charge). The latch also comprises built into or integrated into the circuitry of the latch an integrated recovery mechanism (104). The integrated recovery mechanism functions to hold the state of the charge device when the latch and the surrounding logic are in a powered off state, e.g., powered down or inactive. The integrated recovery mechanism of the invention allows for maintaining the state of the latch without the need for an uninterrupted voltage supply to maintain the state. The integrated recovery mechanism maintains the state of the charge device independent of the charge device. The latch also comprises a hold signal (112) which is distributed to the integrated recovery mechanism. The latch also comprises a data signal input (e.g., D) (108) allocated to the charge device and a data signal output (e.g., Q) (114) distributed from the charge device. The latch also comprises a clock signal (106) allotted to the charge device.

In another embodiment of the invention when the supply voltage rail (110) is active, e.g., powered on or powered up, the clock signal input maintains the state of the charge device. However, when the supply voltage rail is inactive, the integrated recovery mechanism maintains the state of the charge device independent of the state of the charge device. Thus, when powered, down it is the integrated recovery mechanism, not the charge device, that maintains the state/charge. When the voltage supply rail is powered up again, after at least one full clock signal cycle, the state held in the integrated recovery mechanism is transferred to the charge device and can then be processed as an output. In yet another embodiment, when the supply voltage rail is inactive and in a powered down stage, the hold signal is drawn from a part of an integrated circuit or chip that is active or powered up.

FIG. 2 illustrates a flow diagram according to an embodiment of the invention. FIG. 2 illustrates a method for decreasing voltage leakage in dynamic state saving latches comprising periodically supplying a supply voltage and supplying a hold signal to the integrated recovery mechanism of the latch wherein when the supply voltage is active, a clock signal input maintains the state of the charge device of the latch and when the supply voltage is inactive a hold signal supplied to the integrated recovery mechanism maintains the state of the charge device. The method for decreasing voltage leakage in a dynamic voltage state saving latch electrical circuit comprises: providing a charge device adapted as a storage element (200); integrating an integrated recovery mechanism (202); connecting a supply voltage rail to the charge device (204); distributing a hold signal to the integrated recovery mechanism (206); allocating a data signal input to the charge device (208); allotting a clock signal to the charge device (210); and distributing a data signal output from the charge device. The integrated recovery mechanism of the method maintains a state of the charge device independent of the charge device. The integrated recovery mechanism holds the charge of the device using a capacitor rather than a full latch with separate voltage rail to maintain the state. The signal wire of the integrated recovery mechanism supplies enough current, less than a voltage rail, to maintain the state of the circuit. The state of the latch is maintained without the need to keep a voltage rail active.

The method also comprises providing a supply voltage (e.g., Vdd) to the supply voltage rail so that the clock signal input maintains the state of the charge device. After removing the supply voltage from the charge device in a powered down stage (212), the state of the charge device is maintained by the integrated recovery mechanism with out the need of a supply voltage from the supply voltage rail (214). Power down, e.g., shut down mode or an inactive voltage rail, is as simple as stopping the global clock signal to the latch, and then turning on the hold signal, and then turning off the supply voltage. In other embodiments of the invention, the hold signal is constantly maintained and need not be turned on. As long as the hold signal is active, the dynamic latch is able to maintain its state.

When powering up the latch, the supply voltage rail is reactivated to provide voltage to the circuit. After a full clock signal cycle, the integrated recovery mechanism, which has maintained the state of the charge device during the power down stage, updates the state of charge device (216). More particularly, upon powering up from a powered down state, a strict timing sequence must occur that keeps the clock signal off until the supply voltage reaches its full stable state. For this reason, a full clock signal cycle is required, after the supply voltage is resumed, before the state of the storage element, e.g. charge device or capacitor, is reestablished from the state saved by the integrated recovery mechanism. As such the state of the charge device is maintained even when all surrounding logic is powered down. In yet another embodiment of the invention, the hold signal is provided externally from voltage domains or voltage islands that are active when the voltage domain of the latch is inactive (i.e., powered down) or the hold signal is provide externally from the chip which comprises the latch, e.g., from a pad wire.

FIG. 3 is a schematic illustrating a silicon die (300) with three voltage islands: voltage domain A (302), voltage domain B (306) and voltage domain C (308). Voltage domain B, by way of illustration, comprises a voltage saving state saving latch of the invention, as more particularly described above. Thus, in the method of the invention, when voltage domain B is powered down, the integrated recover mechanism maintains the state of the latch until such time as the voltage domain is powered up again.

More particularly, a dynamic latch design has been presented such that in normal mode, the integrated recovery mechanism portion of the design is isolated from the primary data to latch path. The clock signal must operate at a greater than the capacitance constant of the recovery mechanism portion of latch so that the current state is not lost. If the latch is clock signal gated, then either the hold signal must be pulsed or locked high. Prior to the clock restarting, the hold signal is released. When the supply voltage is off, first the clock signal is gated, and then the hold signal is brought active, followed by the supply voltage being allowed to be turned off. When the supply voltage is turned on after a power down state, first the supply voltage is returned to the circuit, the hold signal is dropped and normal clock operation follows. The clocks must restart within the minimum recovery mechanism capacitance time constant, or the state saved by the integrate recovery mechanism may be lost.

Even more particularly, the invention provides a capacitive or 1T storage element to store state during power down. The power requirements of hold signal and the routing complexity of the hold signal grid would not exceed that of keeping a secondary latch powered up in most state saving latches. Since the capacitive load of the integrated recovery mechanism only needs to maintain the state, the power requirements of the hold signal should be less than maintaining a powered on second, e.g., shadow latch in other state saving latches.

When a voltage island, as depicted in the schematic of FIG. 3, is powered down, the refresh period for a given voltage island size and latch count will ensure each dynamic state-saving latch of the invention is refreshed within is a specified retention interval, as determined by parameter in the art, for a given junction temperature (Tj) range (e.g., −50C to 155C, −25C to 130C or 0C-105C). The hold signal circuitry and hold signal supply grid is non-interruptible. It consists of hold signal control logic and control signals distributed to the latches. A normal read of the state of the latch will automatically refresh the dynamic latch. The latch control logic with programmable chip-specific parameters will maintain a counter that keeps track of the refresh period to ensure a read by the hold signal control logic occurs from each dynamic latch in the voltage island within the specified retention interval.

Complex read circuitry is also not required as the target for the capacitive storage element would be very limited, e.g., the storage node itself. Because of this, one embodiment for the present invention may be an array static random access memory (SRAM) like array, for example. A hold signal grid may even be implemented efficiently even in a sparse layout of these latches, e.g., flip-flops. Hold signal lines may also be routed much like clock trees. The latch of the present method comprises a hold signal which has just enough voltage to maintain state, but would not support any transitions. The hold signal requires the extra power bus overhead to maintain the state of the latch in the integrated recovery mechanism for the storage element, but does not require any refresh circuitry.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A dynamic state-saving latch electrical circuit comprising:
   a charge device;
   an integrated recovery mechanism;
   a single supply voltage rail connected to said charge device and said integrated recovery mechanism, wherein when said supply voltage rail is active, said charge device maintains a state of said charge device and wherein when said supply voltage rail is inactive, said integrated recovery mechanism maintains a state of said charge device;
   a hold signal generator connected to said integrated recovery mechanism, wherein when said supply voltage rail is inactive, said hold signal generator is adapted to generate a hold signal and to provide said hold signal to said integrated recovery mechanism,
   wherein said hold signal generator provides said hold signal from one of:
     a voltage domain that does not comprise said latch and is active; and
     an external source not on said voltage domain.

2. The latch of claim 1, wherein said integrated recovery mechanism holds said state independently of said charge device.

3. The latch of claim 1, wherein said hold signal uses less power than said voltage rail.

4. A dynamic state-saving latch electrical circuit comprising:
   a charge device;
   an integrated recovery mechanism, wherein said integrated recovery mechanism and said charge device are on a first voltage domain;
   a single supply voltage rail connected to said charge device and said integrated recovery mechanism; and
   a hold signal generator connected to said integrated recovery mechanism,
   wherein when said supply voltage rail is active, said charge device maintains a state of said charge device and wherein when said supply voltage rail is inactive, said hold signal generator is adapted to control said integrated recovery mechanism to maintain a state of said charge device, and
   wherein said hold signal is provided from a second voltage domain that does not comprise said latch and is active or wherein said hold signal is provided from an external source not on one of said first voltage domain and said second voltage domain.

5. The latch of claim 4, wherein when said supply voltage rail is inactive, said hold signal generator is adapted to generate said hold signal.

6. The latch of claim 4, wherein said hold signal uses less power than said voltage rail.

7. The latch of claim 4, wherein said integrated recovery mechanism is adapted to maintain said state without the need for additional voltage rails.

8. A method of decreasing current leakage in a dynamic state saving latch electrical circuit comprising:
   periodically supplying a supply voltage to a charge device within said circuit,
   maintaining a state of said charge device with a clock signal input when said supply voltage rail is active;
   maintaining said state of said charge device with an integrated recovery mechanism when said supply voltage rail is inactive, and
   wherein said supplying comprises reactivating said supply voltage after inactivating said supply voltage and said method further comprises restoring said state to said charge device from said integrated recovery mechanism after at least one full clock signal cycle after said reactivating of said supply voltage.

9. The method of claim 8, wherein when said supply voltage rail is inactive, said method further comprises providing a hold signal.

10. The method of claim 8, wherein said maintaining of said state of said charge device maintains said state independently of said charge device using integrated recovery mechanism.

11. A method of decreasing voltage leakage in a dynamic state saving latch electrical circuit comprising:
   periodically supplying a supply voltage to a charge device within said circuit; and
   supplying a hold signal to an integrated recovery mechanism
   maintaining a state of said charge device with a clock signal input when said supply voltage rail is active;
   maintaining said state of said charge device with an integrated recovery mechanism when said supply voltage rail is inactive,
   wherein when said supply voltage rail is inactive, said method further comprises providing a hold signal, and
   wherein said supplying comprises reactivating said supply voltage after inactivating said supply voltage and said method further comprises restoring said state to said charge device from said integrated recovery mechanism after at least one full clock signal cycle after said reactivating of said supply voltage.

12. The method of claim 11, wherein said maintaining of said state of said charge device maintains said state independently of said charge device using integrated recovery mechanism.

13. A method of decreasing voltage leakage in a dynamic state saving latch electrical circuit comprising:
   periodically supplying a supply voltage to a charge device within said circuit; and
   supplying a hold signal to an integrated recovery mechanism maintaining a state of said charge device with a clock signal input when said supply voltage rail is active;

maintaining said state of said charge device with an integrated recovery mechanism when said supply voltage rail is inactive, wherein when said supply voltage rail is inactive, said method further comprises providing a hold signal, wherein said supplying comprises reactivating said supply voltage after inactivating said supply voltage and said method further comprises restoring said state to said charge device from said integrated recovery mechanism after at least one full clock signal cycle after said reactivating of said supply voltage, and wherein said hold signal generator provides said hold signal from one of:

a voltage domain that does not comprise said latch and is active; and an external source not on said voltage domain.

14. The method of clam 11, wherein said hold signal uses less power than said voltage rail.

* * * * *